US012633883B2

(12) United States Patent
Jang et al.

(10) Patent No.: US 12,633,883 B2
(45) Date of Patent: May 19, 2026

(54) SENSING AND AMPLIFYING CIRCUIT RELATED TO A SENSING MARGIN

(71) Applicant: SK hynix Inc., Icheon-si (KR)

(72) Inventors: Yeonsu Jang, Icheon-si (KR); Woongrae Kim, Icheon-si (KR); Jung Min Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 554 days.

(21) Appl. No.: 18/098,576

(22) Filed: Jan. 18, 2023

(65) Prior Publication Data

US 2024/0120890 A1 Apr. 11, 2024

(30) Foreign Application Priority Data

Oct. 11, 2022 (KR) ......................... 10-2022-0130004

(51) Int. Cl.
*H03K 5/00* (2006.01)
*H03F 3/04* (2006.01)
*H03K 5/24* (2006.01)

(52) U.S. Cl.
CPC ................. *H03F 3/04* (2013.01); *H03K 5/24* (2013.01); *G01K 2217/00* (2013.01); *H03F 2200/468* (2013.01); *H03K 2005/00013* (2013.01)

(58) Field of Classification Search
CPC ....... H03F 3/04; H03F 2200/468; H03K 5/24; H03K 2005/00013; G01K 2217/00
USPC ........................................................ 330/291
See application file for complete search history.

(56) References Cited

U.S. PATENT DOCUMENTS

| | | | | |
|---|---|---|---|---|
| 9,019,772 B1* | 4/2015 | Lin | ......................... | G11C 16/32 |
| | | | | 365/185.23 |
| 2010/0118612 A1* | 5/2010 | Hibino | ................... | G11C 16/24 |
| | | | | 365/194 |
| 2014/0294047 A1* | 10/2014 | Jeong | ....................... | G01K 7/21 |
| | | | | 374/183 |
| 2016/0277044 A1* | 9/2016 | Song | ......................... | H03F 3/19 |
| 2016/0359553 A1* | 12/2016 | Won | ......................... | H04B 7/24 |
| 2020/0075063 A1* | 3/2020 | Lovett | ...................... | G11C 7/22 |
| 2022/0172772 A1* | 6/2022 | Lee | .................... | G11C 11/40622 |

FOREIGN PATENT DOCUMENTS

| | | |
|---|---|---|
| KR | 100193450 B1 | 6/1999 |
| KR | 20180024057 A | 3/2018 |
| KR | 1020210063242 A | 6/2021 |

* cited by examiner

*Primary Examiner* — Ly D Pham
(74) *Attorney, Agent, or Firm* — WILLIAM PARK AND ASSOCIATES LTD.

(57) ABSTRACT

A sensing and amplifying circuit includes a driving voltage control circuit configured to control a voltage level of a driving voltage based on a surrounding temperature of the sensing and amplifying circuit, a delay control circuit configured to generate a line connection signal and an inverted line connection signal in response to a delay start signal by being supplied with the driving voltage, and a sense amplifier configured to perform a sensing and amplifying operation in response to the line connection signal and the inverted line connection signal. An interval between enable timing of the line connection signal and enable timing of the inverted line connection signal is adjusted as the surrounding temperature changes.

16 Claims, 10 Drawing Sheets

FIG.3

| TEMPERATURE | TCODE<3:1> | VS_ISO |
|:-----------:|:----------:|:------:|
| -30℃ | 0001 | 0.80V |
| -20℃ | 0010 | 0.82V |
| -10℃ | 0011 | 0.84V |
| 0℃ | 0100 | 0.86V |
| 10℃ | 0101 | 0.88V |
| 20℃ | 0110 | 0.90V |
| 30℃ | 0111 | 0.92V |
| ⋮ | ⋮ | ⋮ |
| 90℃ | 1101 | 1.04V |

FIG.5

SENSING AND AMPLIFYING CIRCUIT RELATED TO A SENSING MARGIN

CROSS-REFERENCE TO RELATED APPLICATION

The present application claims priority under 35 U.S.C. § 119(a) to Korean application number 10-2022-0130004, filed in the Korean Intellectual Property Office on Oct. 11, 2022, the entire disclosure of which is incorporated herein by reference.

BACKGROUND

1. Technical Field

The present disclosure relates to a sensing and amplifying circuit, and more particularly, to a sensing and amplifying circuit related to a sensing margin.

2. Related Art

In general, an electronic device may include multiple sense amplifiers for performing a sensing and amplifying operation of sensing and amplifying data loaded onto a signal line. A sensing margin of the sense amplifier is an element that is necessary for a stable sensing and amplifying operation, so that research of a scheme capable of improving a sensing margin for each temperature and for each operation mode is required.

SUMMARY

In an embodiment, a sensing and amplifying circuit may include a driving voltage control circuit configured to control a voltage level of a driving voltage based on a surrounding temperature of the sensing and amplifying circuit, a delay control circuit configured to generate a line connection signal and an inverted line connection signal in response to a delay start signal by being supplied with the driving voltage, and a sense amplifier configured to perform a sensing and amplifying operation in response to the line connection signal and the inverted line connection signal. An interval between enable timing of the line connection signal and enable timing of the inverted line connection signal is adjusted as the surrounding temperature changes.

In another embodiment, a sensing and amplifying circuit may include a first delay control circuit configured to generate a line connection signal that is enabled at timing that has elapsed by a first delay interval from timing at which a delay start signal is enabled, based on a driving voltage and an operation mode signal, a second delay control circuit configured to generate an inverted line connection signal that is enabled at timing that has elapsed by a second delay interval from the timing at which the delay start signal is enabled, based on the operation mode signal, and a sense amplifier configured to perform a sensing and amplifying operation on data that has been loaded onto a signal line and an inverted signal line, when both the line connection signal and the inverted line connection signal are enabled.

BRIEF DESCRIPTION OF THE DRAWINGS

FIG. 3 is a table illustrating voltage levels of driving voltages that are generated for each temperature in the sensing and amplifying circuit according to an embodiment of the present disclosure.

FIG. 5 is a timing diagram for describing an operation of intervals between enable timing of a line connection signal and enabling timing of an inverted line connection signal being adjusted for each temperature in the sensing and amplifying circuit according to an embodiment of the present disclosure.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level," For example, when a signal having a first voltage corresponds to a signal having a "logic high level," a signal having a second voltage may correspond to a signal having a "logic low level." According to an embodiment, a "logic high level" may be set to a voltage higher than a "logic low level," According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

A "logic bit set" may mean a combination of logic levels of bits included in a signal. When a logic level of each of the bits included in the signal is changed, a logic bit set of the signal may be differently set. For example, if two bits are included in a signal, a logic bit set of the signal may be set as a first logic bit set when logic levels of the two bits included in the signal are a "logic low level" and a "Magic low level", and may be set as a second logic bit set when logic levels of the two bits included in the signal are a "logic low level", and a "logic high level."

Hereafter, the teachings of the present disclosure will be described in more detail through embodiments. The embodiments are only used to exemplify the teachings of the present disclosure, and the scope of the present disclosure is not limited by the embodiments.

An embodiment of the present disclosure may provide a sensing and amplifying circuit capable of improving a sensing margin.

Figure 1:
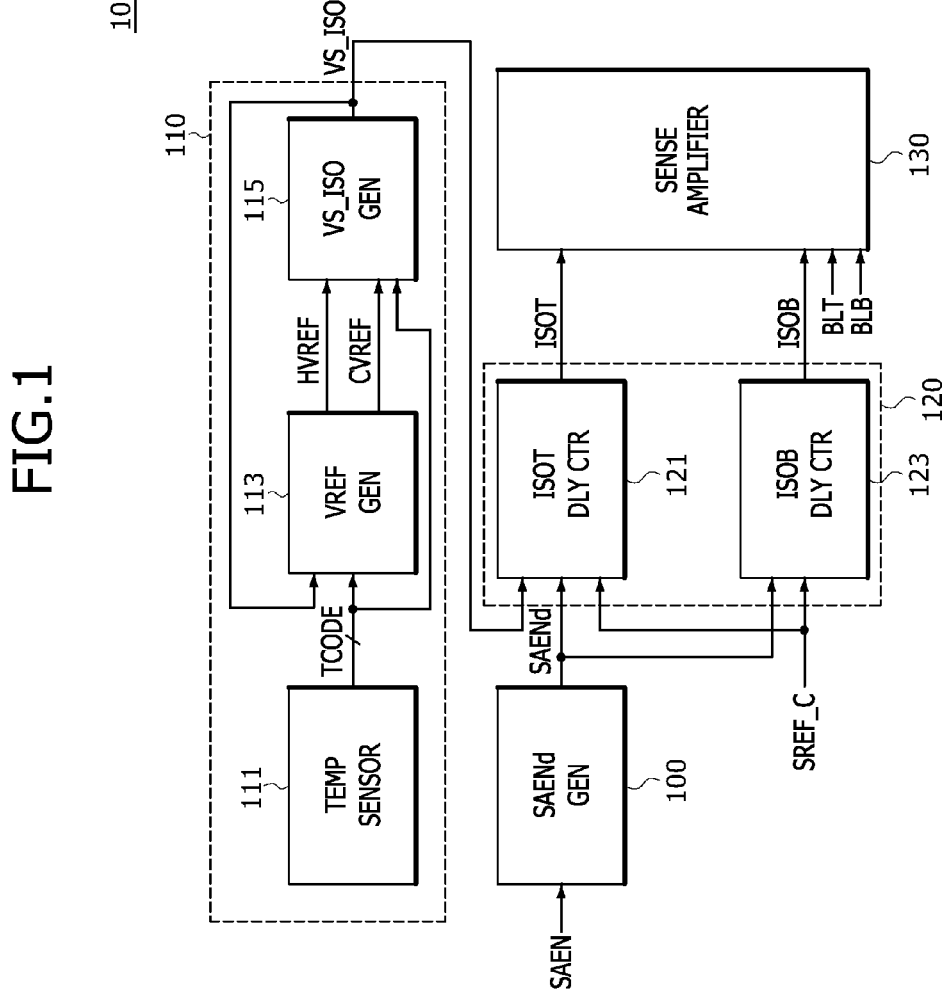
FIG. 1 is a block diagram illustrating a construction of a sensing and amplifying circuit according to an embodiment of the present disclosure.

FIG. 1 is a block diagram illustrating a construction of a sensing and amplifying circuit 10 according to an embodiment of the present disclosure. As illustrated in FIG. 1, the sensing and amplifying circuit 10 may include a delay start signal generation circuit (SAENd GEN) 100, a driving voltage control circuit 110, a delay control circuit 120, and a sense amplifier (SENSE AMPLIFIER) 130.

The delay start signal generation circuit 100 may generate a delay start signal SAENd in response to a start signal SAEN. The delay start signal generation circuit 100 may generate the delay start signal SAENd that is enabled at timing that has been delayed by a default interval from timing at which the start signal SAEN is enabled. The start signal SAEN may be enabled for a sensing and amplifying operation. The default interval may be set as various intervals through a test operation that is performed before a sensing and amplifying operation, and may be removed in some embodiments.

The driving voltage control circuit 110 may include a temperature sensor (TEMP SENSOR) 111, a reference voltage generation circuit (VREF GEN) 113, and a driving voltage generation circuit (VS_ISO GEN) 115.

The temperature sensor 111 may generate a temperature code TCODE that corresponds to a surrounding temperature of the sensing and amplifying circuit 10. The temperature code TCODE may include multiple bits, A logic bit set of bits that are included in the temperature code TCODE may be determined depending on a surrounding temperature of the sensing and amplifying circuit 10, For example, when the surrounding temperature is –30° C., a logic bit set of the temperature codes TCODE<4:1> including 4 bits may be set to "0001." When, for example, the surrounding temperature is 90° C., a logic bit set of the temperature codes TCODE<4:1> including 4 bits may be set to "1101."

The reference voltage generation circuit 113 may be connected to the temperature sensor 111 and the driving voltage generation circuit 115, may receive the temperature code TCODE from the temperature sensor 111, and may receive a driving voltage VS_ISO from the driving voltage generation circuit 115. The reference voltage generation circuit 113 may generate a high temperature reference voltage HVREF and a low temperature reference voltage CVREF based on the temperature code TCODE and the driving voltage VS_ISO. In a high temperature test operation that is performed in the state in which a surrounding temperature of the sensing and amplifying circuit 10 is a high temperature, the reference voltage generation circuit 113 may set a voltage level of the high temperature reference voltage HVREF based on the temperature code TCODE, and may adjust the voltage level of the high temperature reference voltage HVREF by detecting the number of error bits based on the driving voltage VS_ISO that is generated based on the high temperature reference voltage HVREF. A method of detecting the number of error bits may be performed in a way to perform a write operation and read operation on test pattern data (not illustrated) and to detect whether data output as a result of the read operation is the same as the test pattern data, After the high temperature test operation is performed, in the state in which a surrounding temperature of the sensing and amplifying circuit 10 is a low temperature, the reference voltage generation circuit 113 may perform a low temperature test operation of setting a voltage level of the low temperature reference voltage CVREF based on the temperature code TCODE and adjusting the voltage level of the low temperature reference voltage CVREF by detecting the number of error bits based on the driving voltage VS_ISO that is generated based on the low temperature reference voltage CVREF. The aforementioned high temperature test operation, low temperature test operation, and method of detecting the number of error bits are merely examples, and the present disclosure is not limited thereto.

The driving voltage generation circuit 115 may be connected to the temperature sensor 111 and the reference voltage generation circuit 113, may receive the temperature code TCODE from the temperature sensor 111, and may receive the high temperature reference voltage HVREF and the low temperature reference voltage CVREF from the reference voltage generation circuit 113. The driving voltage generation circuit 115 may generate the driving voltage VS_ISO based on the temperature code TCODE, the high temperature reference voltage HVREF, and the low temperature reference voltage CVREF. The driving voltage generation circuit 115 may generate the driving voltage VS_ISO that has a higher voltage level as a surrounding temperature of the sensing and amplifying circuit 10 becomes higher, and may generate the driving voltage VS_ISO that has a lower voltage level as the surrounding temperature becomes lower. For example, the driving voltage generation circuit 115 may generate the driving voltage VS_ISO of 0.80 V when a surrounding temperature of the sensing and amplifying circuit 10 is –30° C. For example, the driving voltage generation circuit 115 may generate the driving voltage VS_ISO of 0.86 V when the surrounding temperature is 0° C. For example, the driving voltage generation circuit 115 may generate the driving voltage VS_ISO of 1.04 V when the surrounding temperature is 90° C.

The delay control circuit 120 may be connected to the delay start signal generation circuit 100 and the driving voltage control circuit 110, may receive the delay start signal SAENd from the delay start signal generation circuit 100, and may receive the driving voltage VS_ISO from the driving voltage control circuit 110. The delay control circuit 120 may generate a line connection signal ISOT based on the driving voltage VS_ISO, an operation mode signal SREF_C, and the delay start signal SAENd, and may generate an inverted line connection signal ISOB in response to the operation mode signal SREF_C and the delay start signal SAENd. The delay control circuit 120 may generate the line connection signal ISOT that is enabled at timing that has elapsed by a first delay interval (td1 in FIG. 5) from timing at which the delay start signal SAENd is enabled. The delay control circuit 120 may set the first delay interval (td1 in FIG. 5) to be shorter based on the driving voltage VS_ISO that has a higher voltage level as a surrounding temperature of the sensing and amplifying circuit 10 becomes higher, and may set the first delay interval (td1 in FIG. 5) to be longer based on the driving voltage VS_ISO that has a lower voltage level as the surrounding temperature becomes lower. The operation mode signal SREF_C may be generated in a preset operation mode, for example, when a self-refresh operation is entered. When entering a preset operation mode, the delay control circuit 120 may adjust the first delay interval (td1 in FIG. 5) as a set interval. The delay control circuit 120 may generate the inverted line connection signal ISOB that is enabled at timing that has elapsed by a second delay interval (td2 in FIG. 5) from timing at which the delay start signal SAENd is enabled. When entering a preset operation mode, the delay control circuit 120 may adjust the second delay interval (td2 in FIG. 5) as a set interval. When entering a preset operation mode, the delay control circuit 120 may adjust the first delay interval (td1 in FIG. 5) and the second delay interval (td2 in FIG. 5) as set intervals. The line connection signal ISOT and the inverted line connection signal ISOB may be enabled at the same timing in the preset operation mode. The delay control circuit 120 may include a first delay control circuit (ISOT DIN CTR) 121 and a second delay control circuit (ISOB DIY CTR) 123.

The first delay control circuit 121 may be connected to the delay start signal generation circuit 100 and the driving voltage generation circuit 115, may receive the delay start signal SAENd from the delay start signal generation 100, and may receive the driving voltage VS_ISO from the driving voltage generation circuit 115. The first delay control circuit 121 may generate the line connection signal ISOT based on the driving voltage VS_ISO, the operation mode signal SREF_C, and the delay start signal SAENd. The first delay control circuit 121 may generate the line connection signal ISOT that is enabled at timing that has elapsed by the first delay interval (td1 in FIG. 5) from timing at which the delay start signal SAENd is enabled. The first delay control circuit 121 may set the first delay interval (td1 in FIG. 5) to be shorter based on the driving voltage VS_ISO that has a higher voltage level as a surrounding temperature of the sensing and amplifying circuit 10 becomes higher, and may set the first delay interval (td1 in FIG. 5) to be longer based on the driving voltage VS_ISO that has a lower voltage level as the surrounding temperature becomes lower. When entering a preset operation mode, the first delay control circuit 121 may adjust the first delay interval (td1 in FIG. 5) as a set interval.

The second delay control circuit 123 may be connected to the delay start signal generation circuit 100, and may receive the delay start signal SAENd from the delay start signal generation circuit 100. The second delay control circuit 123 may generate the inverted line connection signal ISOB in response to the operation mode signal SREF_C and the delay start signal SAENd. The second delay control circuit 123 may generate the inverted line connection signal ISOB that is enabled at timing that has elapsed by the second delay interval (td2 in FIG. 5) from timing at which the delay start signal SAENd is enabled. When entering a preset operation mode, the second delay control circuit 123 may adjust the second delay interval (td2 in FIG. 5) as a set interval.

The sense amplifier 130 may be connected to the delay control circuit 120, and may receive the line connection signal ISOT and the inverted line connection signal ISOB from the delay control circuit 120. The sense amplifier 130 may perform a sensing and amplifying operation on data that has been loaded onto a signal line BLT and an inverted signal line BLB, in response to the line connection signal ISOT and the inverted line connection signal BOB. When both the line connection signal ISOT and the inverted line connection signal ISOB are generated, the sense amplifier 130 may perform a sensing and amplifying operation on data that has been loaded onto the signal line BLT and the inverted signal line BLB. In an embodiment, as an interval between enable timing of the line connection signal ISOT and enable timing of the inverted line connection signal ISOB is set to be shorter as a surrounding temperature of the sensing and amplifying circuit 10 becomes higher, a solid sensing margin of the sense amplifier 130 can be improved more than an island sensing margin of the sense amplifier 130. In an embodiment, as an interval between enable timing of the line connection signal ISOT and enable timing of the inverted line connection signal ISOB is set to be longer as a surrounding temperature of the sensing and amplifying circuit 10 becomes lower, an island sensing margin of the sense amplifier 130 can be improved more than a solid sensing margin of the sense amplifier 130. In an embodiment, because the line connection signal ISOT and the inverted line connection signal ISOB are simultaneously generated in a preset operation, a solid sensing margin of the sense amplifier 130 can be improved more than an island sensing margin of the sense amplifier 130. In this example, the sense amplifier 130 has been expressed as one block, but may be implemented in large numbers by the number of signal lines.

Figure 2:
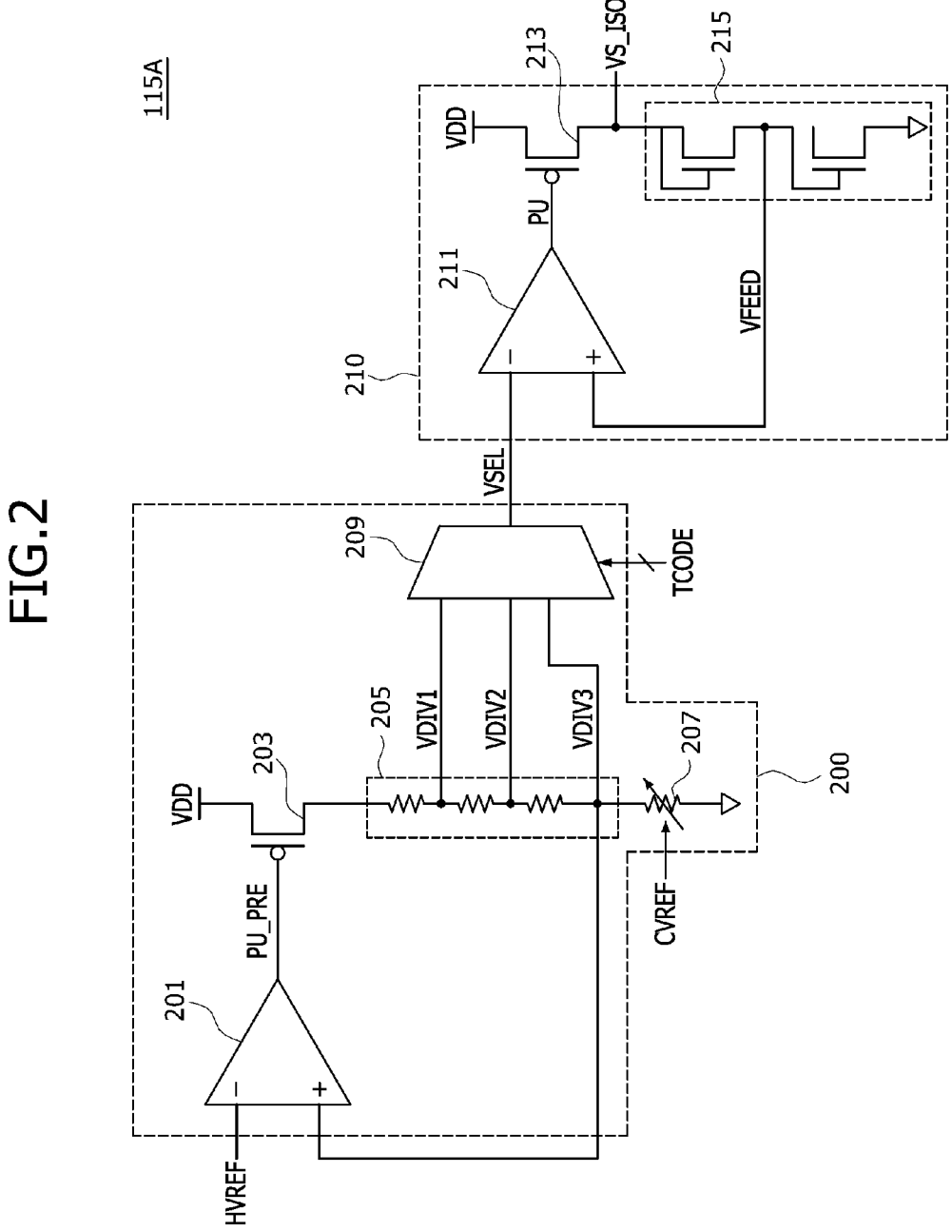
FIG. 2 is a circuit diagram of a driving voltage generation circuit according to an embodiment of the present disclosure.

FIG. 2 is a circuit diagram of a driving voltage generation circuit 115A according to an example of the driving voltage generation circuit 115. As illustrated in FIG. 2, the driving voltage generation circuit 115A may include a selection voltage generation circuit 200 and a driving output circuit 210.

The selection voltage generation circuit 200 may include a first comparator 201, a first driving element 203, a division voltage generation circuit 205, a variable resistor 207, and a selection voltage generator 209. The first comparator 201 may generate a pre-pull-up signal PU_PRE based on the high temperature reference voltage HVREF and a feedback division voltage VDIV3. The first comparator 201 may generate the pre-pull-up signal PU_PRE capable of turning on the first driving element 203 when the feedback division voltage VDIV3 has a lower voltage level than the high temperature reference voltage HVREF. The first driving element 203 may supply the division voltage generation circuit 205 with a power supply voltage VDD by being turned on by the pre-pull-up signal PU_PRE when the feedback division voltage VDIV3 has a lower voltage level than the high temperature reference voltage HVREF. The division voltage generation circuit 205 may generate a first division voltage VDID1, a second division voltage VDIV2, and the feedback division voltage VDIV3 by performing a voltage division operation based on the power supply voltage VDD that is supplied through the first driving element 203. A resistance value of the variable resistor 207 may be adjusted based on the low temperature reference voltage CVREF. The first division voltage VDID1 may be generated to have a higher voltage level than the second division voltage VDIV2. The second division voltage VDIV2 may be generated to have a higher voltage level than the feedback division voltage VDIV3. The selection voltage generator 209 may select any one of the first division voltage VDID1, the second division voltage VDIV2, and the feedback division voltage VDIV3 as a selection voltage VSEL based on the temperature code TCODE, and may output the selection voltage VSEL.

The driving output circuit 210 may include a second comparator 211, a second driving element 213, and a feedback voltage generation circuit 215. The second comparator 211 may generate a pull-up signal PU based on the selection voltage VSEL and a feedback voltage VFEED. The second comparator 211 may generate the pull-up signal PU capable of turning on the second driving element 213 when the feedback voltage VFEED has a lower voltage level than the selection voltage VSEL. The second driving element 213 may supply the feedback voltage generation circuit 215 with the power supply voltage VDD by being turned on by the pull-up signal PU when the feedback voltage VFEED has a lower voltage level than the selection voltage VSEL. The feedback voltage generation circuit 215 may generate the feedback voltage VFEED by performing a voltage division operation based on the power supply voltage VDD that is supplied through the second driving element 213.

FIG. 3 is a table illustrating voltage levels of driving voltages that are generated for each temperature in the sensing and amplifying circuit 10 according to an embodiment of the present disclosure.

As illustrated in FIG. 3, when a surrounding temperature of the sensing and amplifying circuit 10 is –30° C., a logic bit set of the temperature codes TCODE<4:1> including 4 bits may be set to "0001", and the driving voltage VS_ISO that is generated by the driving voltage control circuit 110 may be set to 0.80 V, When a surrounding temperature of the sensing and amplifying circuit 10 is –20° C., a logic bit set of the temperature codes TCODE<4:1> including 4 bits may be set to "0010", and the driving voltage VS_ISO that is generated by the driving voltage control circuit 110 may be set to 0.82 V, When a surrounding temperature of the sensing and amplifying circuit 10 is –10° C., a logic bit set of the temperature codes TCODE<4:1> including 4 bits may be set to "0011", and the driving voltage VS_ISO that is generated by the driving voltage control circuit 110 may be set to 0.84 V. When a surrounding temperature of the sensing and amplifying circuit 10 is 0° C., a logic bit set of the temperature codes TCODE<4:1> including 4 bits may be set to "0100", and the driving voltage VS_ISO that is generated by the driving voltage control circuit 110 may be set to 0.86 V, When a surrounding temperature of the sensing and amplifying circuit 10 is lot, a logic bit set of the temperature codes TCODE<4:1> including 4 bits may be set to "0101", and the driving voltage VS_ISO that is generated by the driving voltage control circuit 110 may be set to 0.88 V, When a surrounding temperature of the sensing and amplifying circuit 10 is 20° C., a logic bit set of the temperature codes TCODE<4:1> including 4 bits may be set to "0110", and the riving voltage VS_ISO that is generated by the driving voltage control circuit 110 may be set to 0.90 V. When a surrounding temperature of the sensing and amplifying circuit 10 is 30° C., a logic bit set of the temperature codes TCODE<4:1> including 4 bits may be set to "0111", and the driving voltage VS_ISO that is generated by the driving voltage control circuit 110 may be set to 0.92 V. When a surrounding temperature of the sensing and amplifying circuit 10 is 90° C., a logic bit set of the temperature codes TCODE<4:1> including 4 bits may be set to "1101", and the driving voltage VS_ISO that is generated by the driving voltage control circuit 110 may be set to 1.04 V.

Figure 4:
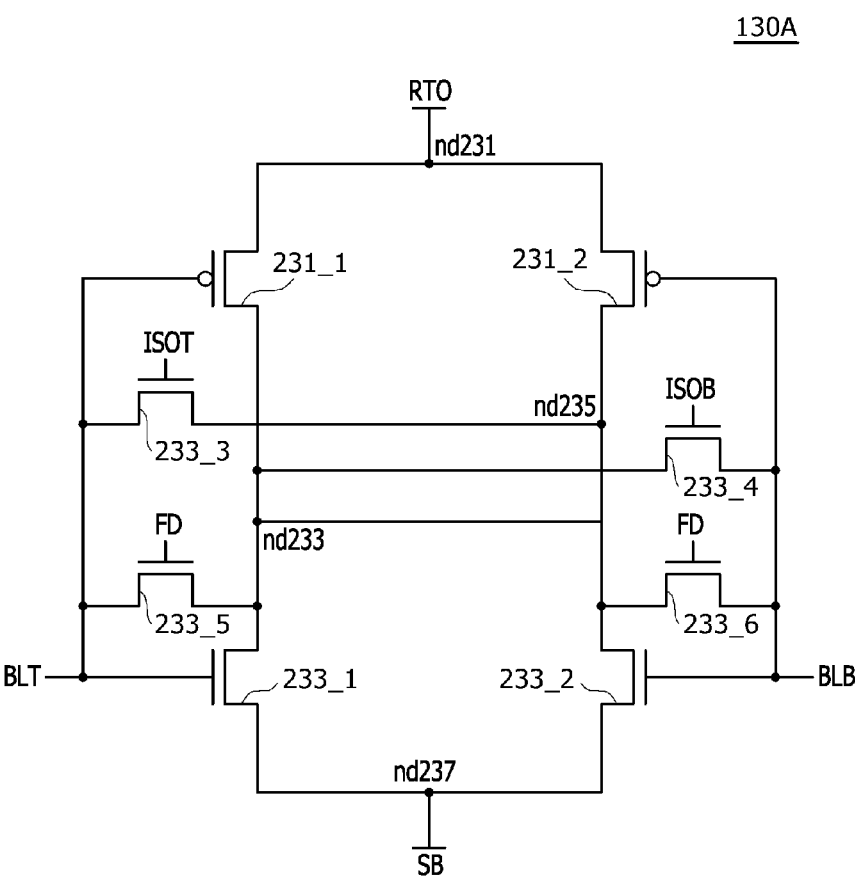
FIG. 4 is a circuit diagram of a sense amplifier according to an embodiment of the present disclosure.

FIG. 4 is a circuit diagram of a sense amplifier 130A according to an example of the sense amplifier 130, As illustrated in FIG. 4, the sense amplifier 130A may include PMOS transistors 231_1 and 231_2 and NMOS transistors 233_1, 233_2, 233_3, 233_4, 233_5, and 233_6. The PMOS transistor 231_1 may be connected between a node nd231 to which a first power source RTO is supplied and a node nd233, and may be turned on based on data that has been loaded onto the signal line BLT. The PMOS transistor 231_2 may be connected between the node nd231 and a node nd235, and may be turned on based on data that has been loaded onto the inverted signal line BLB. The NMOS transistor 233_1 may be connected between the node nd233 and a node nd237 to which a second power source SB is supplied, and may be turned on based on data that has been loaded onto the signal line BLT. The NMOS transistor 233_2 may be connected between the node nd235 and the node nd237, and may be turned on based on data that has been loaded onto the inverted signal line BLB, The NMOS transistor 233_3 may be connected between the signal line BLT and the node nd235, and may be turned on based on the line connection signal ISOT so that the signal line BLT is connected to the node nd235. The NMOS transistor 233_4 may be connected between the inverted signal line BLB and the node nd233, and may be turned on based on the inverted line connection signal ISOB so that the inverted signal line BLB is connected to the node nd233. The NMOS transistor 233_5 may be connected between the signal line BLT and the node nd233, The NMOS transistor 233_6 may be connected between the inverted signal line BLB and the node nd235. The NMOS transistors 2335 and 233_6 may be turned on to correct a mismatch between the PMOS transistors 2311 and 2312 and the NMOS transistors 2331 and 233_2 based on a correction control signal FD.

Figure 5:
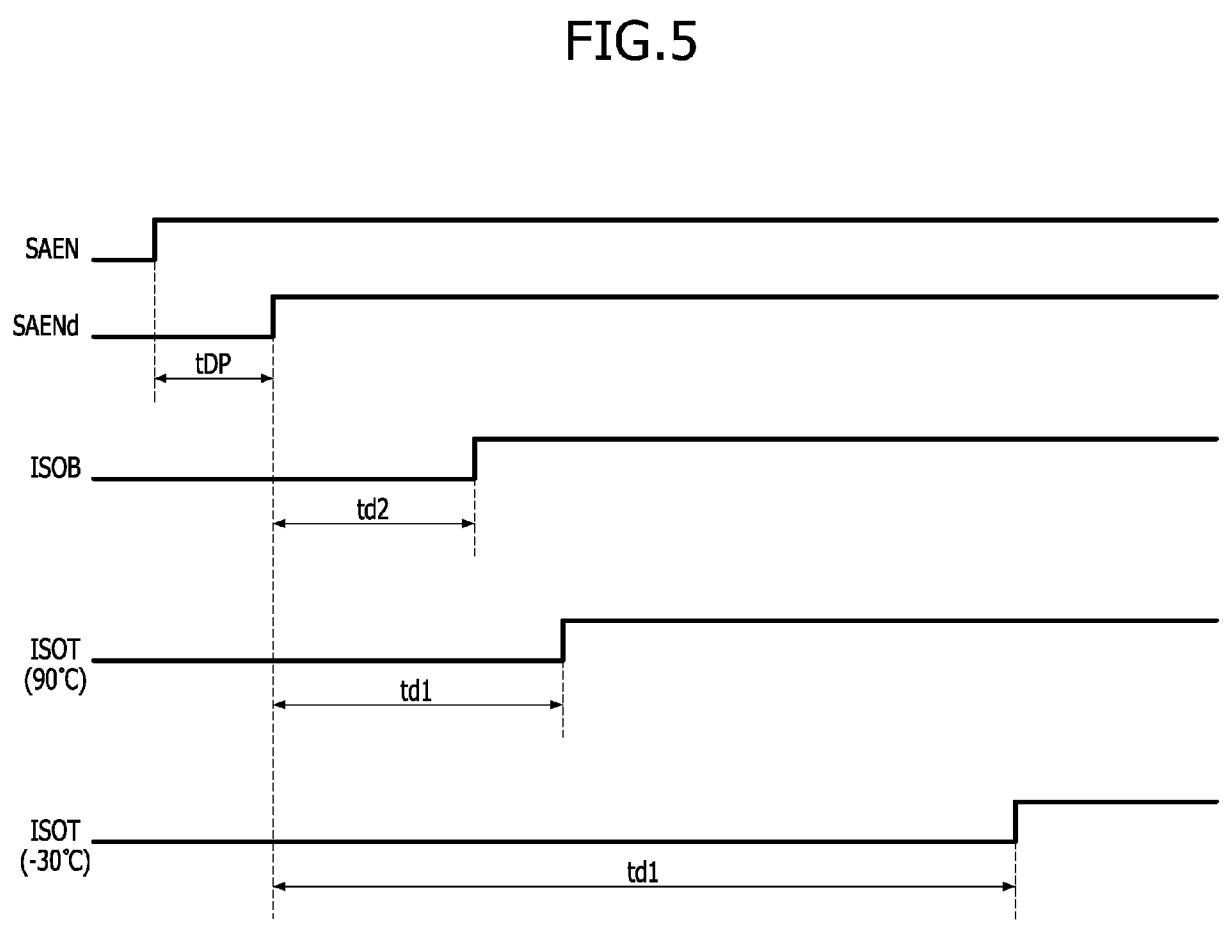

FIG. 5 is a timing diagram for describing an operation of intervals between enable timing of the line connection signal ISOT and enable timing of the inverted line connection signal ISOB being adjusted for each temperature in the sensing and amplifying circuit 10. As illustrated in FIG. 5, the delay start signal SAENd may be enabled at timing that has been delayed by a default interval tDP from timing at which the start signal SAEN that is enabled for a sensing and amplifying operation is enabled. The inverted line connection signal ISOB may be enabled at timing that has been delayed by the second delay interval td2 from the timing at the delay start signal SAENd is enabled. The line connection signal ISOT may be enabled at timing that has been delayed by the first delay interval td1 from the timing at which the delay start signal SAENd is enabled. It may be seen that the first delay interval td1 is set to be shorter at a high temperature of 90° C. than at a low temperature of –30° C. As a surrounding temperature of the sensing and amplifying circuit 10 becomes higher, an interval between enable timing of the inverted line connection signal ISOB and enable timing of the line connection signal ISOT may be set to be shorter. As a surrounding temperature of the sensing and amplifying circuit 10 becomes lower, an interval between enable timing of the inverted line connection signal ISOB and enable timing of the line connection signal ISOT may be set to be longer.

Figure 6:
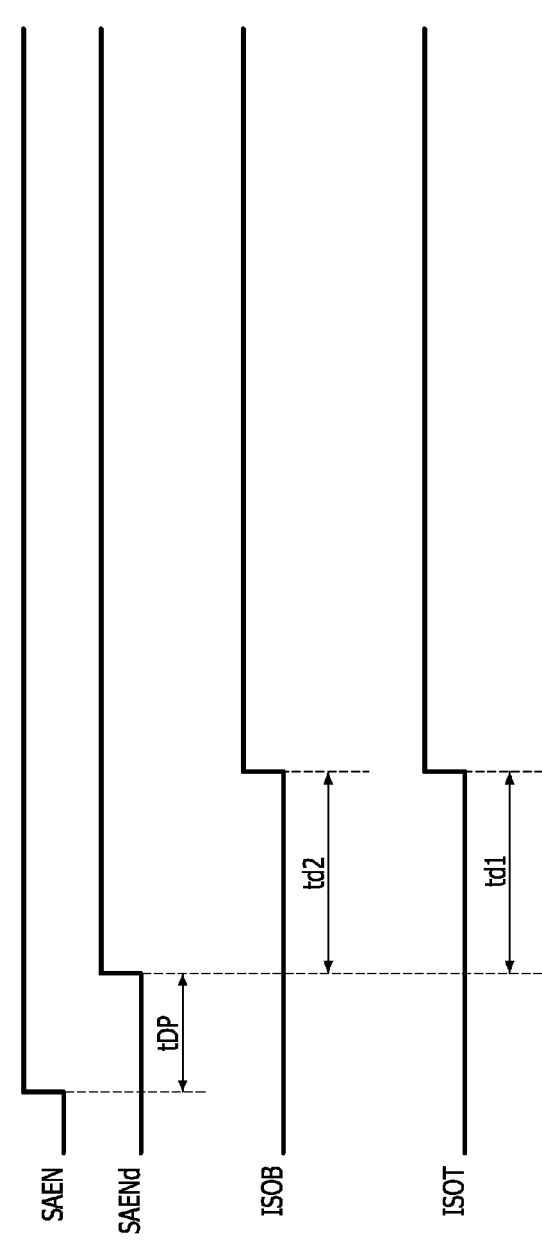
FIG. 6 is a timing diagram for describing an operation of an interval between enable timing of the line connection signal and enable timing of the inverted line connection signal being adjusted in a preset operation mode in the sensing and amplifying circuit according to an embodiment of the present disclosure.

FIG. 6 is a timing diagram for describing an operation of an interval between enable timing of the line connection signal ISOT and enable timing of the inverted line connection signal ISOB being adjusted when the sensing and amplifying circuit 10 enters a preset operation mode. As illustrated in FIG. 6, the delay start signal SAENd may be enabled at timing that has been delayed by the default interval tDP from timing at which the start signal SAEN that is enabled for a sensing and amplifying operation is enabled. The inverted line connection signal ISOB may be enabled at timing that has been delayed by the second delay interval td2 from the timing at which the delay start signal SAENd is enabled. The line connection signal ISOT may be enabled at timing that has been delayed by the first delay interval td1 from the timing at which the delay start signal SAENd is enabled. It may be seen that the first delay interval td1 is set to be the same as the second delay interval td2 in a preset operation mode. In a preset operation mode, enable timing of the inverted line connection signal ISOB and enable timing of the line connection signal ISOT may be identically set.

Figure 7:
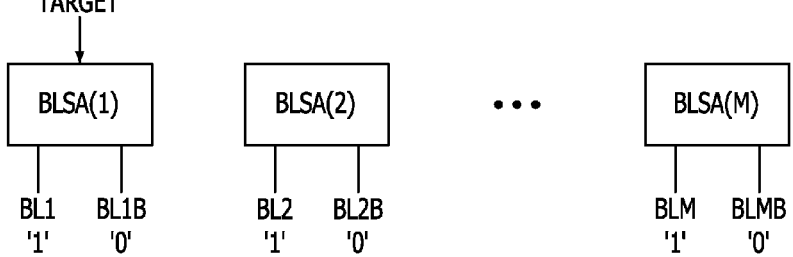
FIGS. 7 and 8 are diagrams for describing solid sensing margins of the sense amplifiers.
Figure 8:
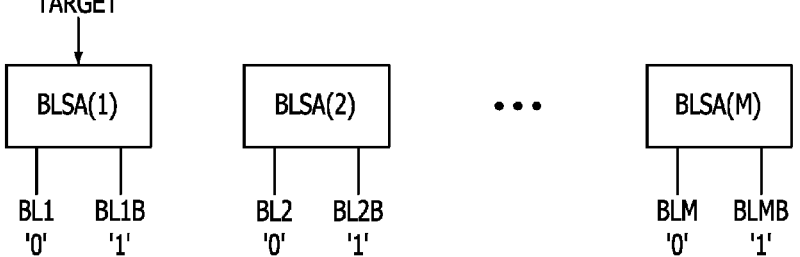

FIGS. 7 and 8 are diagrams for describing solid sensing margins of sense amplifiers BLSA(1) to BLSA(M).

As illustrated in FIG. 7, in an embodiment, when the sense amplifier BLSA(1) is selected as a target and a sensing and amplifying operation is performed in the state in which data "1" is received by the sense amplifiers BLSA(1) to BLSA(M) through data lines BL1 to BLM, respectively, and data "0" is received by the sense amplifiers BLSA(1) to BLSA(M) through inverted data lines BL1B to BLMB, respectively, a solid sensing margin of the data "1" of the sense amplifier BLSA(1) can be improved only when an interval between enable timing of the inverted line connection signal ISOB and enable timing of the line connection signal ISOT, which are applied to each of the sense amplifiers BLSA(1) to BLSA(M), is set to be short.

As illustrated in FIG. 8, in an embodiment, when the sense amplifier BLSA(1) is selected as a target and a sensing and amplifying operation is performed in the state in which data "0" is received by the sense amplifiers BLSA(1) to BLSA(M) through the data lines BL1 to BLM, respectively, and data "1" is received by the sense amplifiers BLSA(1) to BLSA(M) through the inverted data lines BLAB to BLMB, respectively, a solid sensing margin of the data "0" of the sense amplifier BLSA(1) can be improved only when an interval between enable timing of the inverted line connection signal ISOB and enable timing of the line connection signal ISOT, which are applied to each of the sense amplifiers BLSA(1) to BLSA(M), is set to be short.

Figure 9:
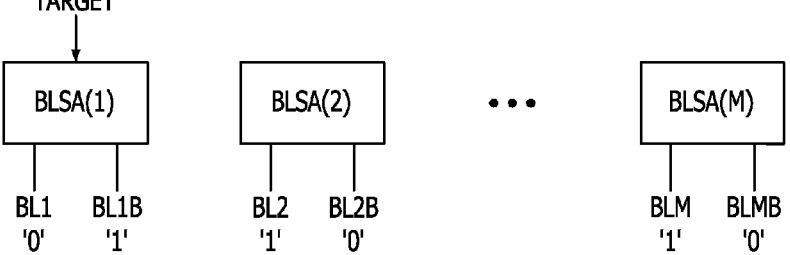
FIGS. 9 and 10 are diagrams for describing island sensing margins of the sense amplifiers.
Figure 10:
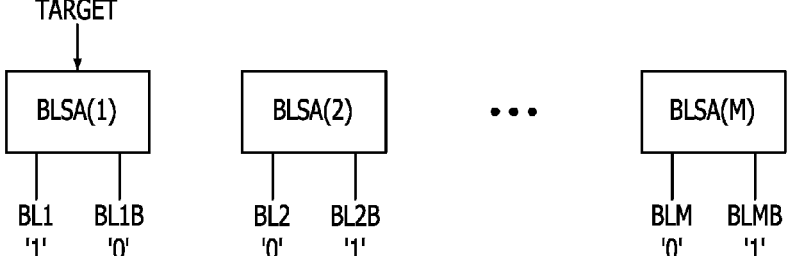

FIGS. 9 and 10 are diagrams for describing island sensing margins of the sense amplifiers BLSA(1) to BLSA(M).

As illustrated in FIG. 9, in an embodiment, when the sense amplifier BLSA(1) is selected as a target and a sensing and amplifying operation is performed in the state in which data "0" is received by the sense amplifier BLSA(1) through the data line BL1, data "1" is received by the sense amplifier BLSA(1) through the inverted data line BL1B, the data "1" is received by the sense amplifiers BLSA(2) to BLSA(M) through the data lines BL2 to BLM, respectively, and data "0" is received by the sense amplifiers BLSA(2) to BLSA(M) through the inverted data lines BL2B to BLMB, respectively, an island sensing margin of the data "0" of the sense amplifier BLSA(1) can be improved only when an interval between enable timing of the inverted line connection signal ISOB and enable timing of the line connection signal ISOT, which are applied to each of the sense amplifiers BLSA(1) to BLSA(M), is set to be long.

As illustrated in FIG. 10, in an embodiment, when the sense amplifier BLSA(1) is selected as a target and a sensing and amplifying operation is performed in the state in which data "1" is received by the sense amplifier BLSA(1) through the data line BL1, data "0" is received by the sense amplifier BLSA(1) through the inverted data line BL1B, data "0" is received by the sense amplifiers BLSA(2) to BLSA(M) through the data lines BL2 to BLM, respectively, and data "1" is received by the sense amplifiers BLSA(2) to BLSA(M) through the inverted data lines BL2B to BLMB, respectively, an island sensing margin of the data "1" of the sense amplifier BLSA(1) can be improved only when an interval between enable timing of the inverted line connection signal ISOB and enable timing of the line connection signal ISOT, which are applied to each of the sense amplifiers BLSA(1) to BLSA(M), is set to be long.

The embodiments of the present disclosure have been described so far. A person having ordinary knowledge in the art to which the present disclosure pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure,

What is claimed is:

1. A sensing and amplifying circuit, comprising:
a driving voltage control circuit configured to control a voltage level of a driving voltage based on a surrounding temperature of the sensing and amplifying circuit;
a delay control circuit configured to generate a line connection signal and an inverted line connection signal in response to a delay start signal by being supplied with the driving voltage; and
a sense amplifier configured to perform a sensing and amplifying operation in response to the line connection signal and the inverted line connection signal,
wherein an interval between enable timing of the line connection signal and enable timing of the inverted line connection signal is adjusted as the surrounding temperature changes.

2. The sensing and amplifying circuit of claim 1, wherein the driving voltage control circuit is configured to set the voltage level of the driving voltage to be higher as the surrounding temperature becomes higher, and is configured to set the voltage level of the driving voltage to be lower as the surrounding temperature becomes lower.

3. The sensing and amplifying circuit of claim 1, wherein the driving voltage control circuit comprises:
a reference voltage generation circuit configured to generate a high temperature reference voltage and a low temperature reference voltage based on a temperature code and the driving voltage; and
a driving voltage generation circuit configured to generate the driving voltage based on the temperature code, the high temperature reference voltage, and the low temperature reference voltage.

4. The sensing and amplifying circuit of claim 3, wherein the temperature code comprises multiple bits having a logic bit set that corresponds to the surrounding temperature.

5. The sensing and amplifying circuit of claim 3, wherein the driving voltage generation circuit comprises:
a selection voltage generation circuit configured to generate a selection voltage based on the temperature code, the high temperature reference voltage, and the low temperature reference voltage; and
a driving output circuit configured to output the driving voltage based on the selection voltage by driving the driving voltage.

6. The sensing and amplifying circuit of claim 5, wherein the selection voltage generation circuit comprises:
a comparator configured to generate a pre-pull-up signal based on the high temperature reference voltage and a feedback division voltage;
a division voltage generation circuit configured to generate at least one division voltage and a feedback division voltage by performing a voltage division operation based on the power supply voltage that is supplied in response to the pre-pull-up signal;
a variable resistor connected to the division voltage generation circuit and configured to have a resistance value of the variable resistor adjusted based on the low temperature reference voltage; and a selection voltage generator configured to select one of the at least one division voltage and the feedback division voltage based on the temperature code and configured to output the selected voltage as the selection voltage.

7. The sensing and amplifying circuit of claim 5, wherein the driving output circuit comprises:
   a comparator configured to generate a pull-up signal based on a feedback voltage and the selection voltage; and
   a feedback voltage generation circuit configured to generate the feedback voltage by performing a voltage division operation based on a power supply voltage that is supplied in response to the pull-up signal.

8. The sensing and amplifying circuit of claim 1, wherein the delay control circuit is configured to set the interval between the enable timing of the line connection signal and the enable timing of the inverted line connection signal to be shorter by being supplied with the driving voltage a voltage level of which is set to a higher voltage level as the surrounding temperature becomes higher.

9. The sensing and amplifying circuit of claim 1, wherein the delay control circuit is configured to set the interval between the enable timing of the line connection signal and the enable timing of the inverted line connection signal to be longer by being supplied with the driving voltage a voltage level of which is set to a lower voltage level as the surrounding temperature becomes lower.

10. The sensing and amplifying circuit of claim 1, wherein the delay control circuit is configured to identically set the enable timing of the line connection signal and the enable timing of the inverted line connection signal in a preset operation mode.

11. The sensing and amplifying circuit of claim 10, wherein the preset operation mode is set as a self-refresh operation.

12. The sensing and amplifying circuit of claim 1, wherein the delay control circuit comprises:

a first delay control circuit configured to generate the line connection signal that is enabled at timing that has elapsed by a first delay interval from timing at which the delay start signal is enabled, based on the driving voltage and an operation mode signal; and
   a second delay control circuit configured to generate the inverted line connection signal that is enabled at timing that has elapsed by a second delay interval from the timing at which the delay start signal is enabled, based on the operation mode signal.

13. The sensing and amplifying circuit of claim 12, wherein:
   the first delay interval is set to be shorter based on the driving voltage that has a higher voltage level as the surrounding temperature becomes higher,
   the first delay interval is set to be longer based on the driving voltage that has a lower voltage level as the surrounding temperature becomes lower, and
   the first delay interval is adjusted as a set interval when the operation mode signal is generated in a preset operation mode.

14. The sensing and amplifying circuit of claim 12, wherein the second delay interval is adjusted as a set interval when the operation mode signal is generated in a preset operation mode.

15. The sensing and amplifying circuit of claim 1, wherein the sense amplifier is configured to perform a sensing and amplifying operation on data that has been loaded onto a signal line and an inverted signal line, when both the line connection signal and the inverted line connection signal are enabled.

16. The sensing and amplifying circuit of claim 1, further comprising a delay start signal generation circuit configured to generate the delay start signal that is enabled at timing that has elapsed by a default interval from timing at which a start signal is enabled.

* * * * *